United States Patent
Pahl et al.

(10) Patent No.: US 9,051,174 B2
(45) Date of Patent: Jun. 9, 2015

(54) METHOD FOR ENCAPSULATING AN MEMS COMPONENT

(75) Inventors: Wolfgang Pahl, Munich (DE); Gregor Feiertag, München (DE)

(73) Assignee: EPCOS AG, Munich (DE)

( * ) Notice: Subject to any disclaimer, the term of this patent is extended or adjusted under 35 U.S.C. 154(b) by 548 days.

(21) Appl. No.: 13/003,148

(22) PCT Filed: Jul. 6, 2009

(86) PCT No.: PCT/EP2009/058520
§ 371 (c)(1),
(2), (4) Date: Apr. 8, 2011

(87) PCT Pub. No.: WO2010/003925
PCT Pub. Date: Jan. 14, 2010

(65) Prior Publication Data
US 2011/0180885 A1    Jul. 28, 2011

(30) Foreign Application Priority Data
Jul. 9, 2008   (DE) ................... 10 2008 032 319

(51) Int. Cl.
*B81C 1/00*         (2006.01)
(52) U.S. Cl.
CPC ..... *B81C 1/00309* (2013.01); *B81B 2201/0257* (2013.01); *B81B 2201/0264* (2013.01); *B81C 1/00047* (2013.01)
(58) Field of Classification Search
USPC ........................................................ 257/415
See application file for complete search history.

(56) References Cited

U.S. PATENT DOCUMENTS

| | | | |
|---|---|---|---|
| 6,781,231 B2 | 8/2004 | Minervini | |
| 7,166,910 B2 | 1/2007 | Minervini | |
| 7,242,089 B2 | 7/2007 | Minervini | |
| 7,843,055 B2 | 11/2010 | Bauer et al. | |
| 8,169,041 B2 * | 5/2012 | Pahl et al. | 257/416 |
| 8,218,794 B2 | 7/2012 | Pahl | |

(Continued)

FOREIGN PATENT DOCUMENTS

| | | | |
|---|---|---|---|
| DE | 10342981 A1 * | 4/2005 | |
| DE | 102006005419 A1 | 8/2007 | |

(Continued)

OTHER PUBLICATIONS

Written Opinion corresponding to International Patent Application No. PCT/EP2009/058520, European Patent Office, dated Mar. 3, 2010, 6 pages.

(Continued)

*Primary Examiner* — Jay C Kim
*Assistant Examiner* — Christopher Culbert
(74) *Attorney, Agent, or Firm* — Nixon Peabody LLP

(57) ABSTRACT

Method for producing an MST device, and MST device
A method for producing an electromechanical transducer is described, wherein
  an MST component is arranged in a container, and
  the container is closed with a cover layer, wherein
  the cover layer is provided with at least one cutout which divides the cover layer into an inner region and an outer region in such a way that both the inner region and the outer region are connected to the top side—facing the cover layer—of the MST component, and
  the inner region is lifted off while the outer region remains adhered.

12 Claims, 4 Drawing Sheets

(56) References Cited

U.S. PATENT DOCUMENTS

Figure 1:
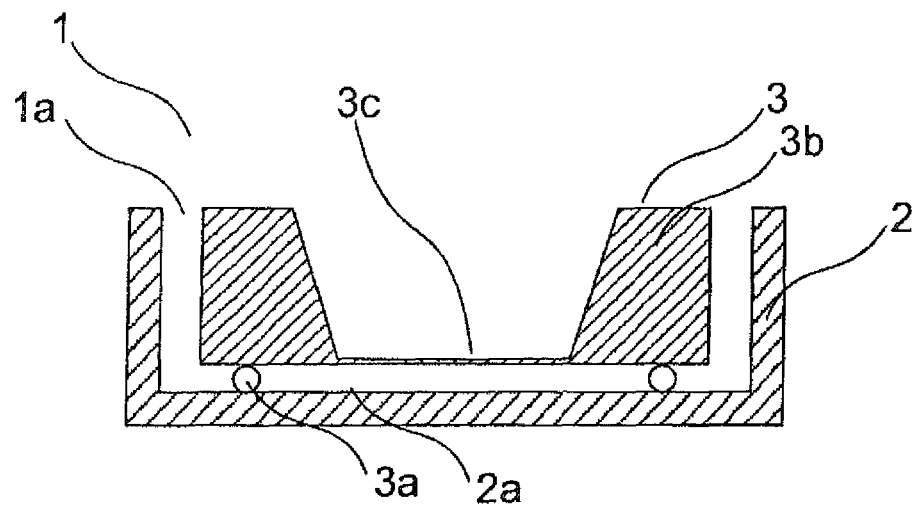

| | | |
|---|---|---|
| 2005/0189635 A1* | 9/2005 | Humpston et al. ............ 257/678 |
| 2007/0013036 A1 | 1/2007 | Zhe et al. |
| 2007/0190691 A1* | 8/2007 | Humpston et al. ............ 438/113 |
| 2009/0232336 A1 | 9/2009 | Pahl |

FOREIGN PATENT DOCUMENTS

| | | | |
|---|---|---|---|
| DE | 102006046292 A1 | 4/2008 | |
| EP | 1722596 A1 | 11/2006 | |
| JP | 05-010838 A | 1/1993 | |
| JP | 11-230846 A | 8/1999 | |
| WO | WO 2007054070 A1 * | 5/2007 | |
| WO | 2008/040326 A1 | 4/2008 | |
| WO | WO 2008040326 A1 * | 4/2008 | ............... H04R 1/08 |

OTHER PUBLICATIONS

International Search Report corresponding to International Patent Application No. PCT/EP2009/058520, European Patent Office, dated Mar. 3, 2010, 3 pages.

\* cited by examiner

METHOD FOR ENCAPSULATING AN MEMS COMPONENT

CROSS-REFERENCE TO RELATED APPLICATIONS

This application is a U.S. National Stage of International Application No. PCT/EP2009/058520, filed Jul. 6, 2009, which claims the benefit of Germany Patent Application No. 102008032319.5, filed on Jul. 9, 2008, both of which are incorporated herein by reference in their entireties.

A method for producing an encapsulated electromechanical component with an advantageous cover layer and also an electromechanical component with such a cover layer are described. In this case, the term electromechanical component is intended also to encompass components having combined elements from microelectronics, micromechanics, microfluidics and micro-optics. Such components are generally also referred to as MEMS (microelectromechanical system) or MOEMS (micro-optoelectromechanical system), or simply as MST (microsystems technology) components. One example is also a viscosity sensor. An MST device is understood to be a serviceable device having an MST component as a functional unit.

One object to be achieved consists in specifying an efficient method for the production of such an MST component, and a resultant device having an MST component.

A method is proposed wherein a carrier substrate, for example a container for housing at least one electrical component, preferably an MST component, is provided. The container is initially opened toward one side and accommodates the MST component in such a way that the latter is arranged at least approximately flush with the container opening, wherein that end side of the MST component which faces the container opening is at least approximately flush with the container opening. Said end side of the MST component is also referred to hereinafter as the top side.

Alongside the MST component, the container can contain further interconnected components, in particular passive components, amplifiers and/or ASICs.

The container with the MST component arranged therein is closed with a covering comprising at least one layer or a cover layer. The covering is referred to hereinafter as cover layer, wherein the cover layer itself can be divided, or have been divided, into a plurality of sublayers.

The cover layer connects the container edge to the top side of the MST component. Depending on the elasticity of the cover layer, the MST component is preferably arranged approximately flush to flush with the container edge. In this case, the cover layer preferably has an elasticity that makes it possible to connect the MST component to the container edge in a stable manner. In this case, it is advantageously possible to dispense with arranging the component flush in a manner abutting the container edge.

In a further method step, the cover layer is provided with at least one cutout, which divides the cover layer into an inner region and an outer region, such that both the inner region and the outer region are connected to the MST component. The cutout completely encloses the inner region. It can extend over the entire layer thickness of the cover layer, or be formed only as far as a depth corresponding to a fraction of said layer thickness.

In a further method step, the inner region of the cover layer is lifted off or pulled off, while the outer region remains adhered. In this case, the inner region of the cover layer can be pulled off for example by means of a lift-off film that has been laminated on, wherein the adhesive strength of the lift-off film on the outer region of the cover layer can be reduced, which can be achieved by means of UV irradiation, for example, in the case of specific films that can be used as lift-off film. The lift-off film can be selectively irradiated on the outer region of the cover layer in order that only this irradiated region acquires a reduced adhesive strength in a targeted manner.

Instead of the irradiation of the lift-off film with UV radiation, the underside of the lift-off film, that is to say its side facing the cover layer, can be provided with adhesives having different adhesion strengths, wherein an adhesive having a lower adhesion strength is used in the outer region of the lift-off film, said outer region covering the outer region of the cover layer, than in the inner region of the lift-off film. The adhesive can also be applied selectively in such a way that little or no adhesive at all is present in the outer region.

In accordance with one embodiment of the method, the cover layer is adhesively bonded to the MST component and the container, wherein a self-adhesive cover layer, for example, is used. The cover layer can be embodied as inherently tacky or it can be provided with an adhesive film which imparts an adhesiveness or adhesive surface to said cover layer.

The cover layer preferably has a carrier layer, to which other layers can be applied. A polymer layer, for example, is suitable as carrier layer.

The cover layer preferably has a thickness of 20 to 100 µm. An optionally present adhesive film of the cover layer can have a thickness of 10 to 25 µm, for example.

In accordance with one embodiment of the method, before the container is closed, an adhesive is applied to the cover layer.

In accordance with one embodiment of the method, the adhesive is applied to the container edge and to the MST component in a structured fashion, that is to say with a geometrical pattern. Preferably, the adhesive effect is set by pressure and/or heat during application or during lamination. In this case, it is possible to use hot melt adhesives or so-called "B-stage" materials, the adhesion effect of which can be manifested by pressure and/or heat.

In a further method step, along the top side of the MST component and optionally also over the edges of the container, in each case a continuous cutout is produced in the cover layer, wherein the cutout is narrower than the structures forming the top side of the MST component, or than the upwardly facing edges of the container. The cutout can in each case be embodied as a narrow trench and enclose an inner region of the cover layer.

Additionally or alternatively, the cutout can be embodied as a perforation or have a perforated region, wherein the distance between the perforation holes is preferably less than the thickness of the cover layer. Consequently, the inner region can be exactly separated in a later method step, such that no undesirable tears arise particularly in the outer region. Such a perforation is suitable for applications in which no further metallization is applied to the cover layer. Otherwise, said metallization would likewise have to be separated in an additional method step, thereby electrically isolating inner and outer regions.

In accordance with one embodiment, the cutout is produced by means of laser ablation, such that, given a suitable choice of the laser wavelength, focus diameter, power, pulse frequency and scanning parameters, an attack on the container and, in particular, the top side of the MST component is preferably avoided.

The cutout can be produced by means of photolithographic processing of the cover layer, wherein a cover layer is used which comprises photolithographically processable and, in particular, light-sensitive material, preferably a positive or negative photoresist. In a subsequent method step, the cover layer is structured by means of scanning exposure or mask exposure and subsequent development, wherein, through the use of solvents, the cutout is washed out or the cover layer is dissolved in the exposed or unexposed region.

In accordance with one embodiment of the method, in one method step, the cover layer and that top side of the MST component and/or of the container edge that has been partly uncovered through the cutout are treated in such a way that they acquire electrically conductive properties. This is achieved for example by the application of a metallic layer by means of sputtering or by electrostatic sputtering of graphite. In this case, the cutout or that region of the top side of the MST component and of the container that has been uncovered through the cutout can be provided with an electrically conductive layer.

The electrical property of the cover layer can be present in the form of a seed layer, where the term seed layer is understood to be an electrically conductive layer that enables further electroplating.

Preferably, a further cutout is produced in the electrically conductive layer, for example in the seed layer, said further cutout being led through as far as the top side of the MST component. This advantageously brings about an electrical isolation or insulation of the inner and outer regions of the cover layer, such that the inner region of the cover layer, which inner region is to be separated later, does not experience electroplating.

Preferably, a metal layer is deposited electrolytically on the seed layer. As a result, a preferably closed, electrically conductive layer is produced, which has the effect that electrical and MST components arranged in the container are better shielded against electromagnetic radiation. A further advantage is the mechanical reinforcement of the cover layer that is obtained as a result, such that the MST component is better protected against environmental effects. A further advantage is the additional adhesion—obtained as a result of electroplating—of the cover layer outer edges to the container and to the MST component. The seed layer or the electrically conductive layer can also come into contact with a metallization which is already situated on the container edge and which, in turn, can be connected to an electrical ground terminal. The seed layer can thus be put at ground potential.

In accordance with one embodiment of the method, a plurality of containers lying alongside one another are provided simultaneously, referred to hereinafter as a panel. In this case, the cover layer is applied over a plurality of containers and the MST components arranged therein. In this case, the panel can be singulated in any desired manner into individual devices comprising MST components and/or into arrays composed of a plurality of associated or interacting MST components.

Furthermore, the container preferably accommodates electrical conductor tracks which make contact with the MST component, wherein the cover layer advantageously protects these conductor track structures against external environmental influences. If the container is embodied in an electrically insulating fashion, then the electrical interactions between the conductor tracks can be minimized.

It is expedient if the container has plated-through holes which contact-connect the electrical conductor track structures or the MST component in the container toward the outside.

Preferably, the container comprises at least one material selected from: aluminum oxide, magnesium oxide, zirconium oxide, titanium dioxide, glass ceramic, aluminum nitride, glass, plastic, in particular high-melting-point thermoplastics or epoxide-based thermosetting plastics, preferably with mineral or other fillers.

As MST component, a microphone, a loudspeaker, a pressure sensor and/or a sensor for measuring atmospheric parameters can be used or inserted into the container.

Besides cost-effective and efficient production, the method affords the advantage that the MST component is protected against physical and chemical effects during the production process.

A device comprising an MST component which is producible directly by a method described in the context of this document is additionally specified.

Independently of the production method, furthermore, a device comprising an MST component, and in particular an electromechanical transducer, is specified, which has a container open on one side, an MST component being arranged in said container. In the container, a cavity is provided between the inner side of the container and the MST component. A covering or a covering comprising a cover layer covers the cavity and connects the MST component to the container, wherein a region of the MST component is freed of the cover layer on its top side facing the container opening.

The cavity preferably serves for the development, propagation and resonance of acoustic waves which can be emitted by a loudspeaker as an example of an encapsulated MST component, toward the outside. The MST component can e.g. also be a microphone or pressure sensor. In this case, the acoustic waves or pressure fluctuations to be measured can pass through the region freed of the cover layer at the open side of the container from the inside toward the outside, or vice versa. However, the cavity can also serve as a chamber in which, for example, a pressure can build up, which can then be measured by the MST component. In the case of an absolute pressure sensor, the cavity can serve as pressure reference. In the case of a microphone, mention is made of the "acoustic back volume".

Preferably, the cover layer comprises a plurality of layers, wherein one layer is preferably a metal layer. In this case, the metal layer can be deposited on a seed layer. The metal layer is preferably directly connected to the top side of the MST component and to the top side of the container frame. A further layer of the cover layer is preferably a carrier film, which contains a polymer, for example, on which the metal layer or even further layers can be applied.

The container, the microphone, the cover layer and also further constituent parts of the electromechanical transducer can be embodied according to at least one example described in this document.

The methods and articles described will be explained in greater detail on the basis of the following exemplary embodiments and figures.

Figure 7:
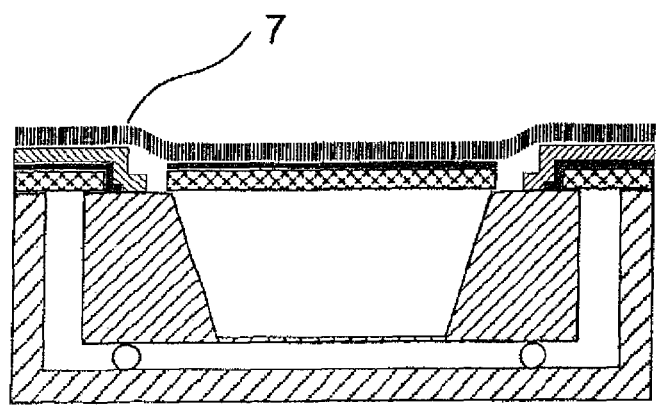
Figure 8:
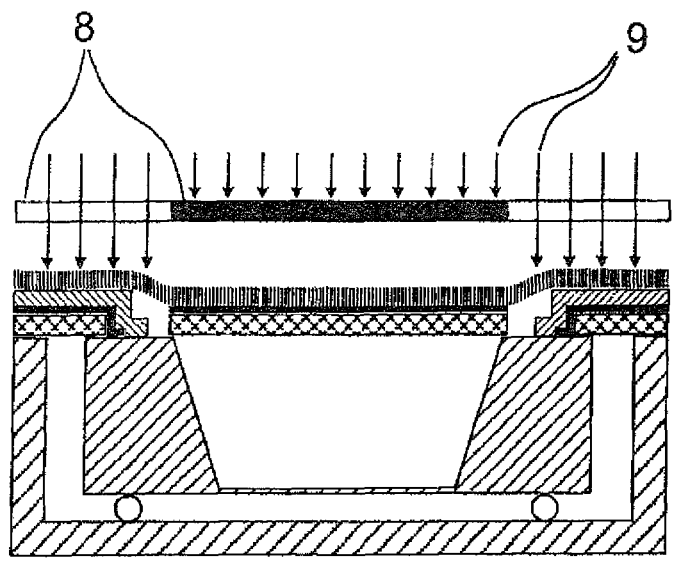
Figure 9:
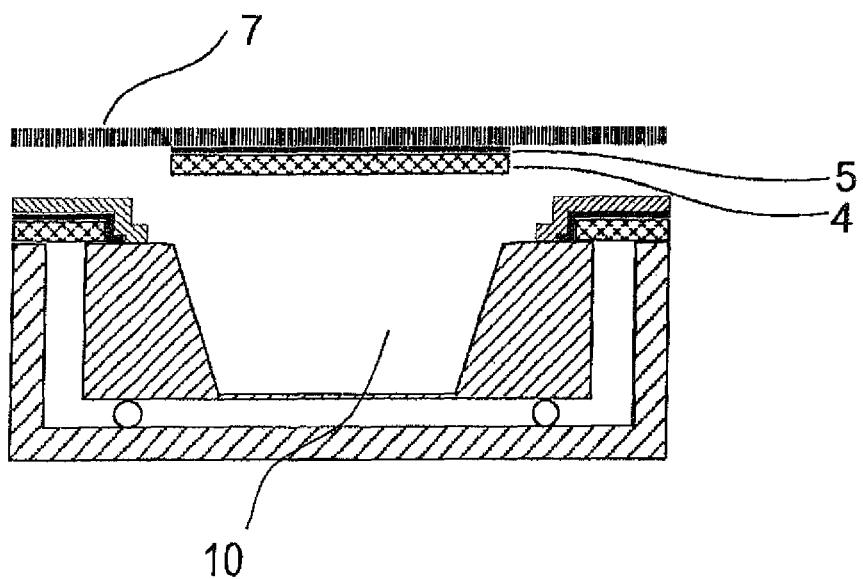

In this case:

FIGS. 1 to 8 show different steps in the production of a device comprising an MST component, FIG. 9 shows an illustration of a completed device, in particular of an electromechanical transducer.

FIG. 1 schematically shows a cross section of an MST device 1, wherein, as MST component 3, an MEMS chip, in this case a microphone, is arranged centrally on the inner base 2a of a cup-shaped container 2, which is injection-molded or laminated preferably in a multilayered fashion. The cup-shaped container 3 can have a circular contour or a polygonal contour; the contour of the container is not restricted to a specific form. On the underside, the microphone 3 has solder balls 3a or a flip-chip contact-connection 3a enabling electrical contact to be made with the microphone also from the inner base 2a of the container. The microphone 3 has a preferably hollow-cylindrical frame element 3b, wherein a membrane 3c is arranged at that end of the frame element 3b which faces the inner base. This can convert its sound-pressure-governed deflection into electrical signals by means of the piezoelectric effect, for example.

It is likewise possible to arrange a second, rigid membrane alongside a moveable membrane. The membrane deflection then brings about between the two membranes a variable electrical capacitance, which can in turn be converted into a voltage signal.

At all events, here the opening 10 uncovered in the last process step (see FIG. 9) serves as sound entrance and the closed-off back volume 1a serves as pressure reference.

A cavity 1a is provided between the outermost lateral surface of the frame element 3b of the microphone 3, the underside of the membrane 3c and the inner wall of the container 3. Said cavity 1a serves as pressure reference, as described.

Electrical conductor tracks (not shown) are preferably applied on the inner base 2a of the container 2, said conductor tracks making electrical contact with the microphone 3 and containing copper, for example. The conductor tracks can electrically connect the microphone toward the outside via plated-through holes (not shown) present in the base of the container.

The container 2 consists of or contains preferably a ceramic having an electrically high insulating property.

The container or the carrier substrate can contain a ceramic basis, i.e. HTCC (High Temperature Cofired Ceramics) or LTCC (Low Temperature Cofired Ceramics), or an organic basis such as, for example, on the basis of epoxide, phenol, polyimide, bismaleimide-triazine, cyanate esters, PTFE (polytetrafluoroethylene). In this case, it is possible to use inorganic fillers, such as e.g. quartz or ceramic particles, glass fiber or a glass film, or else an organic fiber reinforcement, such as e.g. aramid. Moreover, the container can contain or consist of high-temperature thermoplastics, such as e.g. polyetherimide, polyaryl ether ketones, polysulfone, polyphenylene sulfide, polyamide-imide, polyamide, polyphthalamide or polybutylene terephthalate, in particular those in MID processing (Molded Interconnect Device). Glass or silicon is furthermore suitable.

Passive or active components can additionally be arranged in the container 2, at least a portion of which components can be connected up to the MST component 3 or to the microphone 3. In the case of an MEMS chip 3 embodied as a microphone 3, these additional components (not shown) comprise, for example, amplifiers or AD converters and devices for protection against EMI (Electromagnetic Interference) and ESD (Electrostatic Discharge).

Figure 2:
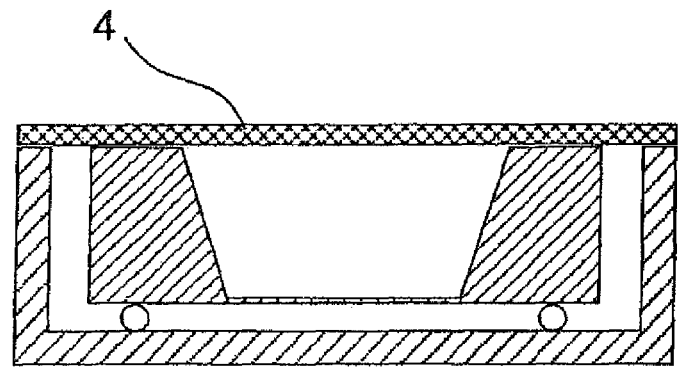

FIG. 2 shows the MST device 1 in accordance with FIG. 1, on which a cover layer 4 is additionally laminated. The cover layer 4 spans and encapsulates both the cavity 1a and the top side of the MST component 3.

The cover layer 4 can be embodied as a self-adhesive polymer or metal film with adhesive coating. In this figure, the top side of the MST component is arranged flush with the container.

Figure 3:
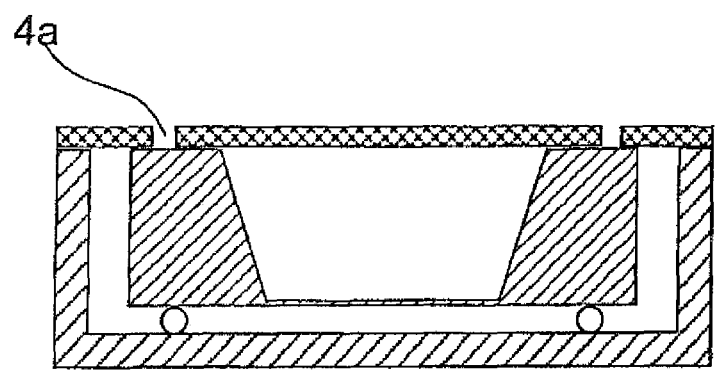

FIG. 3 shows the MST device, here the electromechanical transducer, wherein a cutout 4a has been produced in the cover layer 4, for example by means of laser ablation. The cutout 4a runs on the top side of the MST component 3, wherein a first, outer part of the cover layer between the cutout 4a and the outer wall of the container 2 and a second, inner part initially covers the top side of the MST component 3 at which later no cover layer 4 is desired. In this case, the inner part of the cover layer 4 covers the acoustic front of the microphone 3 shown in this figure. The cutout 4a preferably uncovers a region on the top side of the MST component 3.

Figure 4:
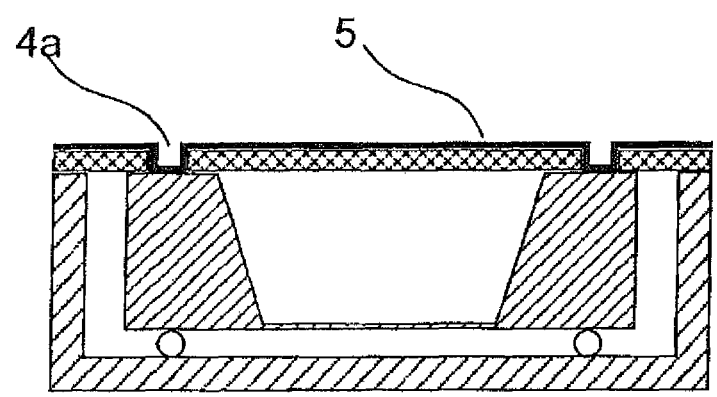

FIG. 4 shows, by comparison with FIG. 3, an additional, at least partly electrically conductive layer 5, which is applied on the cover layer 4 and on that region of the MST component which is uncovered by the cutout 4a. The at least partly electrically conductive layer 5 is preferably a seed layer 5. The metal layer 5 preferably comprises titanium applied by sputtering with a thickness of approximately 100 nm or copper applied by sputtering with a thickness of approximately 200 nm.

Figure 5:
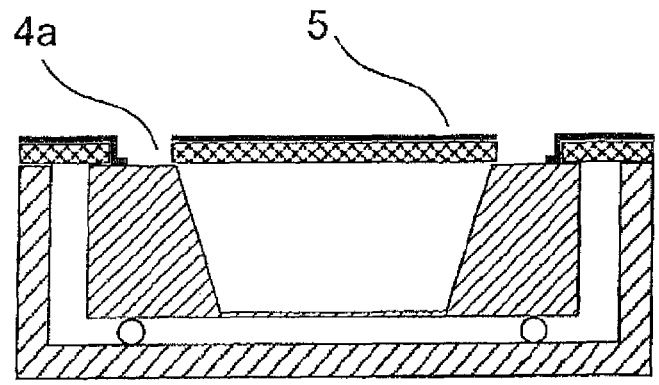

FIG. 5 shows, by comparison with FIG. 4, a widened cutout 4a. The cutout severs the seed layer 5, such that an inner region of the seed layer is electrically insulated from an outer region of the seed layer. The outer region of the seed layer covers the outer region of the cover layer 4 in a manner overlapping onto the top side of the MST component 3. The inner region of the cover layer 4 and the area adhering to the MST component 3 are reduced in size by the extended cutout 4a. That means that the inner region of the cover layer 4 can later be detached from the MST component 3 more easily. Preferably, the inner region of the cover layer 4 in this case overlaps the inner edge of the top side of the MST component 3 only slightly. By contrast, an overlapping for the seed layer 5 onto the top side of the MST component 3 is preferably avoided.

Figure 6:
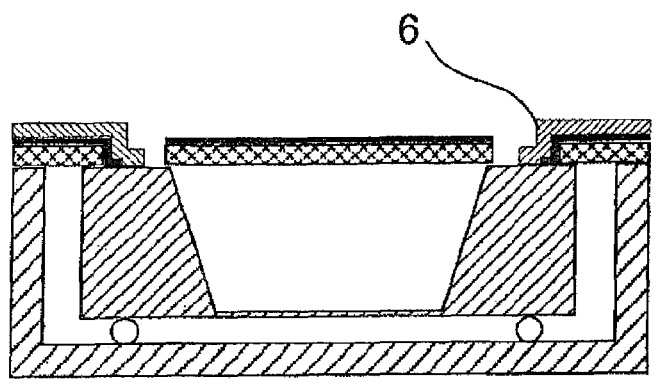

FIG. 6 shows an electroplated MST component 1, wherein a metal layer 6 is deposited electrolytically on the seed layer 5 and coats a portion of the top side of the MST component 3 uncovered by the cutout 4a. This results in a firmer mechanical linking of the outer region of the cover layer 4 on the MST component 3, such that the outer region of the cover layer 4 cannot be detached from the MST component 3 without significant expenditure of force. In this case, the metal layer covers only the outer region of the cover layer. Not only is the adhesion between the outer region of the cover layer 4 on the MST component strengthened, the entire cover layer is also mechanically strengthened by means of the metal layer 6 applied electrolytically. The metal layer 6 furthermore has the advantage of acting as an electromagnetic shielding structure that protects the component or components arranged in the container against externally acting electromagnetic interference. The metal layer 6 applied electrolytically preferably consists of partial layers, in particular composed of Cu and Ni having a total thickness—together with the seed layer—of typically 10 to 100 µm or more.

FIG. 7 shows, by comparison with FIG. 6, an additional lift-off film 7 laminated onto the electromechanical transducer, for example a so-called "UV release tape". The lift-off film contains or consists of a material sensitive to UV light, in accordance with the description of the previous description section. The lift-off film initially adheres uniformly on the entire top side of the cover layer 4.

FIG. 8 shows the exposure of the lift-off film 7, wherein the adhesive strength of the lift-off film is reduced by means of UV light 9 in the outer region of the cover layer 4 in a manner structured by means of a photomask 8, while the inner region maintains its adhesion.

FIG. 9 shows the MST device after the inner region of the cover layer 4 has been selectively detached by means of the lift-off film 7, wherein, after the UV irradiation 9 in accordance with the preceding figure, the inner region of the cover layer adheres to the lift-off film more strongly than the outer region of the cover layer. The opening 10 is produced in the process, said opening enabling free access to component structures of the MST component 3, for example the membrane 3c in FIG. 1.

The method described can preferably be employed for the production of MST devices having encapsulated MST components and, in particular, of electromagnetic transducers on a single substrate, referred to as panel hereinafter. The electromechanical transducers or correspondingly other MST devices can be produced together in a certain quantity and then be singulated. The singulation can be effected by means of high-speed separating sawing or alternative methods such as, for instance, stamping or milling. Besides the protection of the MST component as already described, a further advantage of this production method and of the subsequent singulation resides in the possibility of testing the MST devices prior to singulation, wherein the handling is significantly simpler and more efficient than after singulation. Furthermore, the method makes it possible, elegantly and economically, to carry out whole-area deposition methods optionally including in an aqueous milieu, wherein component structures of the MST components that are actually sensitive to these conditions are outstandingly protected. After all, the sensitive component structures are subsequently uncovered again by the removal of the inner region.

LIST OF REFERENCE SYMBOLS

1 MST device (electromechanical transducer)
1a Cavity
2 Container
2a Inner base of the container
3 Electromechanical component (MST component)
3a Solder balls
3b Frame element
3c Membrane
4 Cover layer
4a Cutout in the cover layer
5 Seed layer
6 Metal layer
7 Lift-off film
8 Photomask
9 UV light
10 Opening

The invention claimed is:

1. A method for encapsulating a microsystems technology (MST) component, comprising:
    arranging the MST component in a container having an opening, the MST component having a top side that faces the opening,
    closing the container with a cover layer by adhesively bonding the cover layer to edges of the container and to the top side of the MST component, wherein the top side faces the cover layer,
    providing the cover layer with at least one cutout closed in a ring-shaped impression which divides the cover layer into an inner region and an outer region in such a way that both the inner region and the outer region keep connected to the top side of the MST component, the at least one cutout being arranged completely over the top side, and
    laminating a lift-off film onto the cover layer, and
    lifting off the inner region with the lift-off film while the outer region of the cover layer remains adhered, wherein the at least one cutout extends over the entire layer thickness of the cover layer.

2. The method as claimed in claim 1, wherein a self-adhesive cover layer is used.

3. The method as claimed in claim 1, further comprising, before the container is closed with the cover layer, applying an adhesive in the connecting region onto an edge of the container and onto the top side of the MST component.

4. The method as claimed in claim 1, wherein a further cutout is produced in the cover layer, in which a region of the top side of the container is uncovered.

5. The method as claimed in claim 1, wherein the cutout is produced in the cover layer by means of laser ablation.

6. The method as claimed in claim 1, wherein the cover layer contains a photolithographically processable material and is structured by means of mask exposure or scanning exposure and development.

7. The method as claimed in claim 1, wherein the cover layer and the cutout are partly coated with a metallic layer.

8. The method as claimed in claim 7, wherein, onto the cover layer after the production of the metallic layer effective over the whole area, the metallic layer and the underlying cover layer are at least partly opened.

9. The method as claimed in claim 1, wherein a panel comprising a plurality of containers including the container is provided, at least one microsystems technology (MST) component being arranged in each of said containers, wherein the cover layer is applied over the plurality of containers of the panel.

10. The method as claimed in claim 1, wherein the lift-off film is applied over the whole area onto the inner and outer regions of the cover layer, and wherein the adhesive strength of the lift-off film on the outer region of the cover layer is reduced by means of UV irradiation.

11. The method as claimed in claim 10, wherein the lift-off film on the outer region of the cover layer is irradiated in a structured fashion.

12. The method as claimed in claim 1, wherein the MST component includes a microphone.

* * * * *